United States Patent
Chandrakumar et al.

[11] Patent Number: 5,973,496
[45] Date of Patent: Oct. 26, 1999

[54] DEVICE TO DETECT MAGNETIC RESONANCE IN THE TIME DOMAIN

[75] Inventors: Narayanan Chandrakumar; Syamalam Venkata Raman, both of Chennai, India

[73] Assignee: Council of Scientific and Industrial Research, New Delhi, India

[21] Appl. No.: 09/021,173

[22] Filed: Feb. 1, 1998

[30] Foreign Application Priority Data

Jul. 31, 1997 [IN] India ................ 2131/DEL/97

[51] Int. Cl.$^6$ ........................... G01V 3/00
[52] U.S. Cl. .......................... 324/322; 324/318
[58] Field of Search ................ 324/322, 318, 324/314, 309, 307, 300

[56] References Cited

U.S. PATENT DOCUMENTS

| | | | |
|---|---|---|---|
| 5,166,620 | 11/1992 | Panosh | 324/322 |
| 5,365,174 | 11/1994 | Yoshikata et al. | 324/322 |
| 5,592,088 | 1/1997 | Matsunaga et al. | 324/322 |

*Primary Examiner*—Louis Arana
*Attorney, Agent, or Firm*—McDermott, Will & Emery

[57] ABSTRACT

A device to detect magnetic resonance in the time domain that includes a radiofrequency (RF) source (46), having an output connected to a transmitter (47), wherein the output of the transmitter (47) is fed to a probe-preamplifier (48). The signal output of the probe-preamplifier (48) is connected to the input of a filter (49), being connected to the input of a phase sensitive detector (50). Another input of the phase sensitive detector (50) is connected to a second output of the RF source (46), with the output of the phase sensitive detector (50) being connected to the input of a digitizer (51). the putput of the digitizer (51) is connected to a computer (52).

12 Claims, 7 Drawing Sheets

DEVICE TO DETECT MAGNETIC RESONANCE IN THE TIME DOMAIN

BACKGROUND

1. Field of the Invention

The present invention relates to an improved device to detect magnetic resonance in the time domain. This would lead to an optimal receiver for detecting magnetic resonance signals.

2. Description of Related Art

Time Domain Magnetic Resonance signals are excited by bursts or pulses of resonant radiofrequency (RF) or microwave radiation and subsequently detected by phase sensitive receivers. These are then Fourier transformed to produce the corresponding frequency spectra. In operating in pulsed mode, two basic factors need to be kept in view:

(i) Efficient use of available transmitter power; and
(ii) Efficient use of detector bandwidth.

The first factor implies that one normally prefers to operate the transmitter from the middle of the spectral window of interest, so that the transmitter field, symmetrically irradiates spectral features on either side of its frequency. The second factor implies that one normally prefers to operate the detector (receiver) from the middle of the spectral window as well, so that the detector filter bandpass just covers the desired spectral window.

Following demodulation by phase sensitive detection (psd), signals that occur originally at distinguishable frequencies $(\omega+\Delta)$ and $(\omega-\Delta)$ are down-converted to frequencies $(\pm\Delta)$ which are identical in magnitude and differ only in sign. In meeting the objective of efficient excitation, therefore, the need arises to distinguish signals at equal but opposite frequencies. This problem does not arise when the transmitter is positioned to one side of the spectral window, so that all signal frequencies are to one side of the transmitter frequency $\omega$. However, this mode of operation, which is standard in single detection mode, is wasteful of the available transmitter power. The problem of frequency sign discrimination has been solved by quadrature detection. When quadrature detection is employed, a given transmitter power level may be used to irradiate twice the spectral width that would be possible in single detection mode. At the same time, the receiver filter bandwidth may be reduced by a factor of 2 compared to single detection, resulting in noise reduction by a factor of $\sqrt{2}$.

Figure 1:
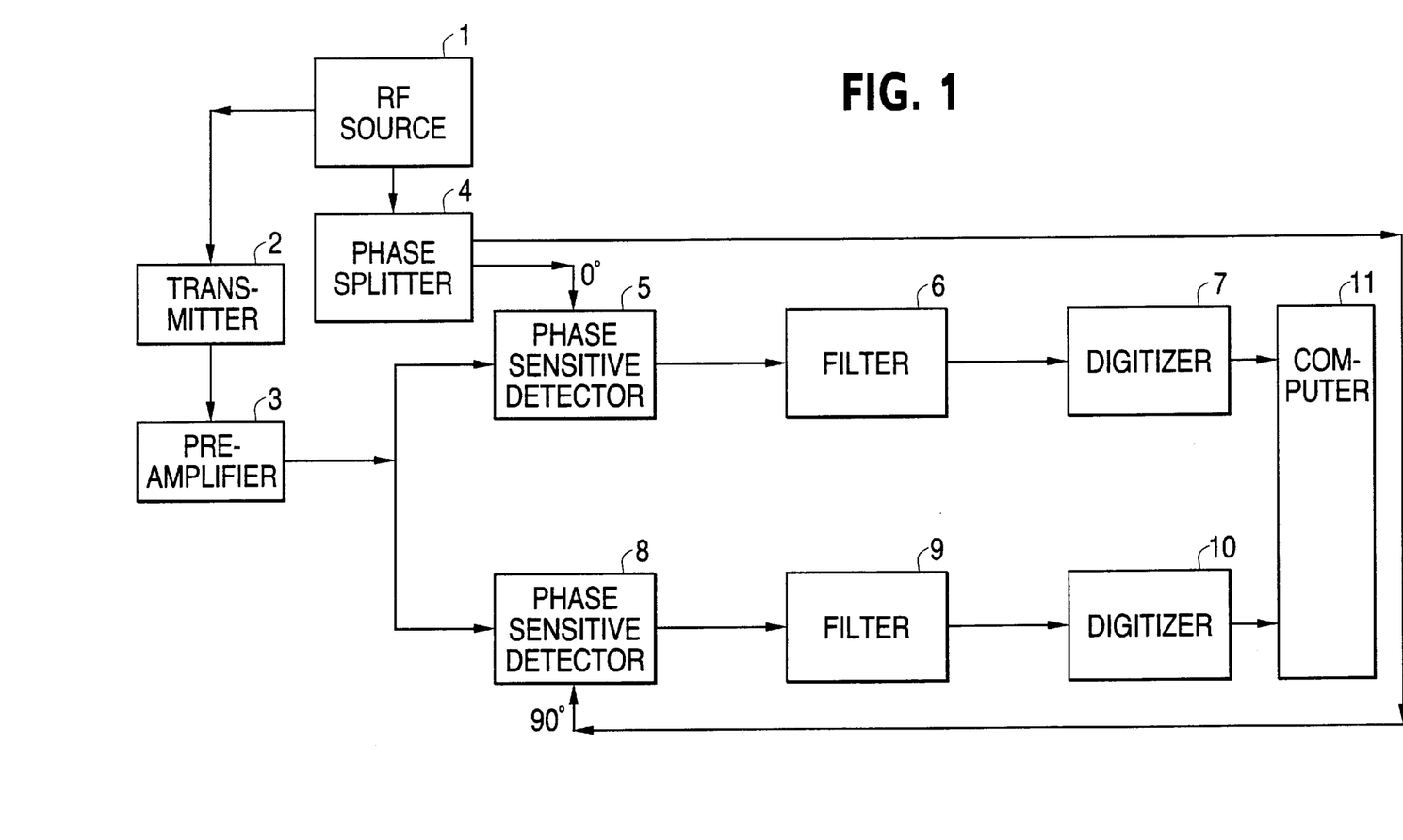

The essential idea in quadrature detection is to detect two components of the signal that are in phase quadrature with each other (eg. the sine and cosine components), so that the desired frequency sign discrimination is achieved, eg. by a complex Fourier transformation. The standard realization of such a system involves the implementation of two identical receiver channels that get reference inputs which are in phase quadrature with each other and simultaneously detect two signals that are in phase quadrature and are paired to form a complex signal. Such a system typically involves two receiver and digitizer channels. A practical limitation of this approach is that a mismatch in the phase and amplitude characteristics of the two channels results in the generation of artifacts known as image peaks. Image peaks are minimized by a careful adjustment and matching of the two receiver channels, and are further suppressed by special phase cycling procedures such as the Cyclically Ordered Phase Sequence (CYCLOPS). A block diagram of this general approach is shown in FIG. 1 of the drawings accompanying this specification.

It essentially consists of two Phase Sensitive Detectors (5, 8), two filters (6, 9) and two digitizers (7, 10), one set for each receiver channel. An RF source (1) feeds a transmitter (2) and a phase splitter (4); the transmitter (2) delivers pulses to a probe-preamplifier (3). The probe houses the sample whose Magnetic Resonance is being investigated. The signal output of (3) is fed to (5) and (8), which get reference inputs from (4) which are in phase quadrature. The output of (5) and (8) is filtered by (6) and (9) and then digitized by (7) and (10) before finally feeding to the computer (11).

Figure 2:
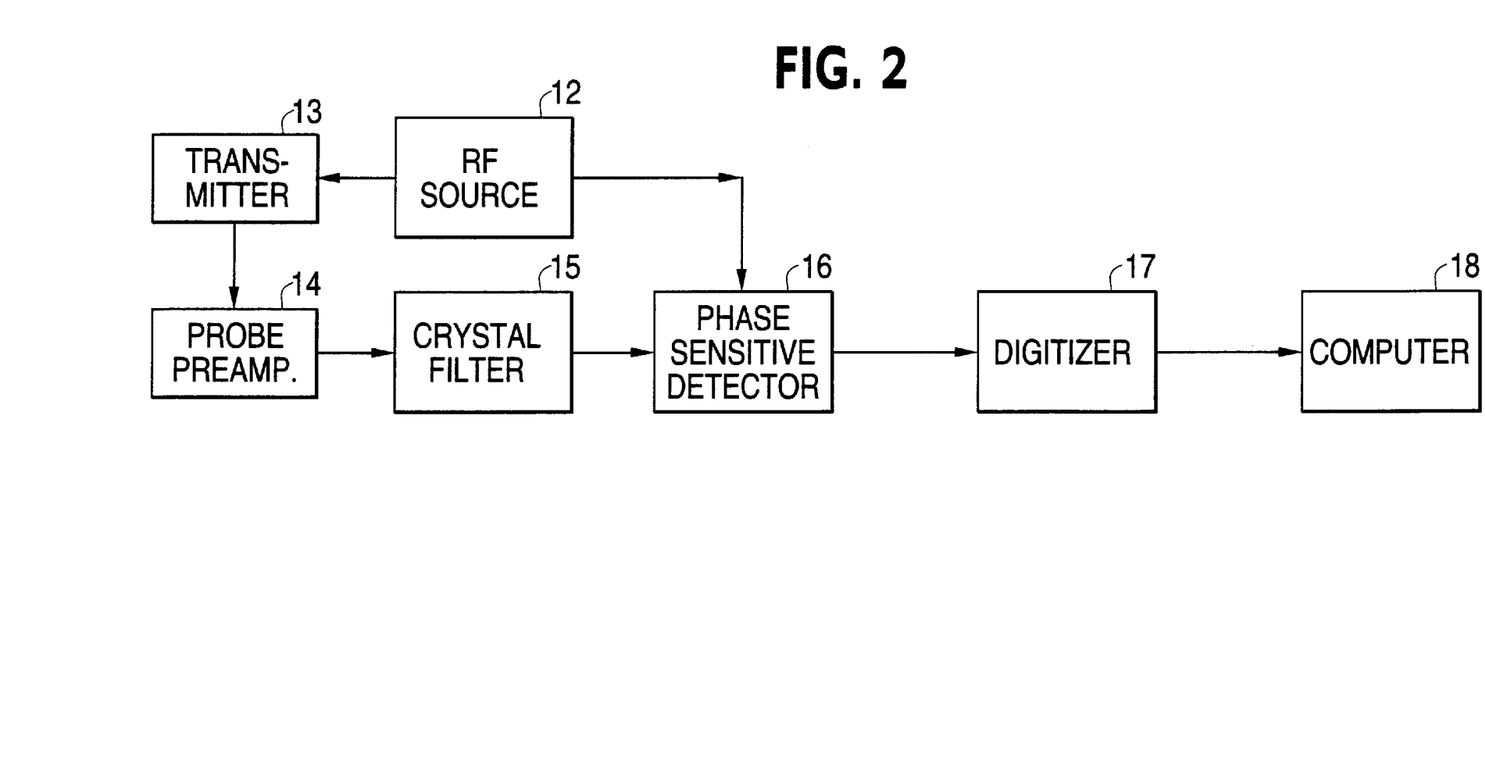
FIG. 2 is a block diagram of a single detection scheme.

Single detection with crystal filter has also been developed as an alternative to quadrature detection. The block diagram of this scheme is shown in FIG. 2 of the drawings accompanying this specification and essentially comprises an RF source (12) that feeds a transmitter (13) and a Phase sensitive Detector (16); the transmitter (13) delivers pulses to a probe-preamplifier (14). The probe houses the sample whose Magnetic Resonance is being investigated. The signal output of 14 is fed to the crystal filter (15), then to 16 and finally to the Digitizer (17) and Computer (18). This scheme typically gains the $\sqrt{2}$ sensitivity advantage of quadrature detection by avoiding noise foldover from the side that is opposite to the spectral window with respect to the receiver reference frequency; however, this scheme cannot avoid positioning the transmitter at one end of the spectral window. The typical crystal filter is a four-pole Butterworth crystal filter, with Quality-factor Q of the order of 10.

Figure 3:
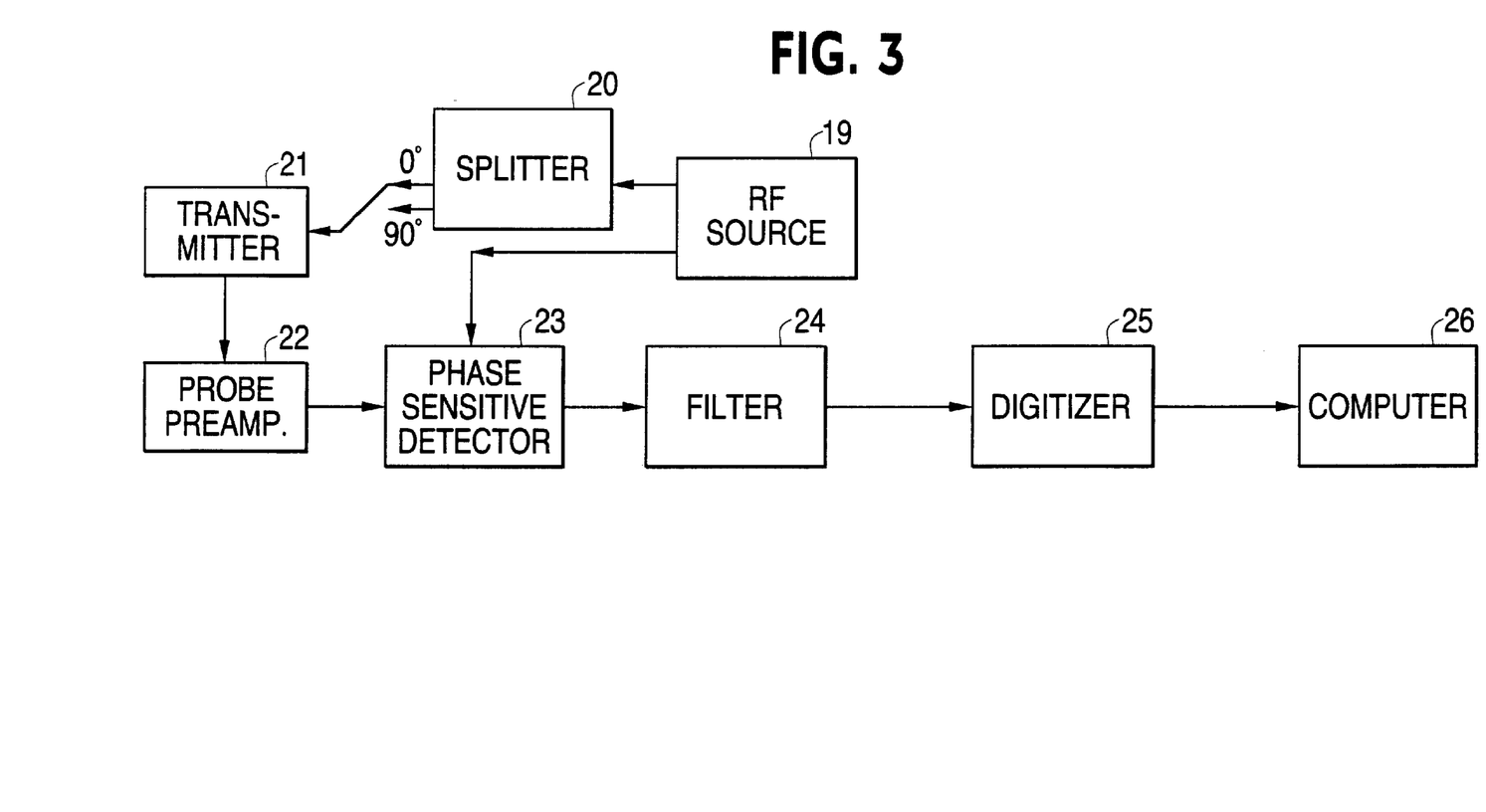
FIG. 3 is a block diagram of another single detection scheme.

Yet another scheme acquires quadrature phase shifted signals on alternate scans in a single detection receiver—by phase shifting the excitation pulse appropriately—and synthesizes the quadrature information by pairing together successive scans to produce a complex signal. Sensitivity is lost in this implementation, while the transmitter may be positioned in the center of the spectral window. A schematic diagram of this implementation is shown in FIG. 3 of the drawings accompanying this specification and essentially comprises an RF source (19), phase splitter (20), transmitter (21), probe-preamplifier (22), Phase Sensitive Detector (23), Filter (24), Digitizer (25) and computer (26).

Figure 4:
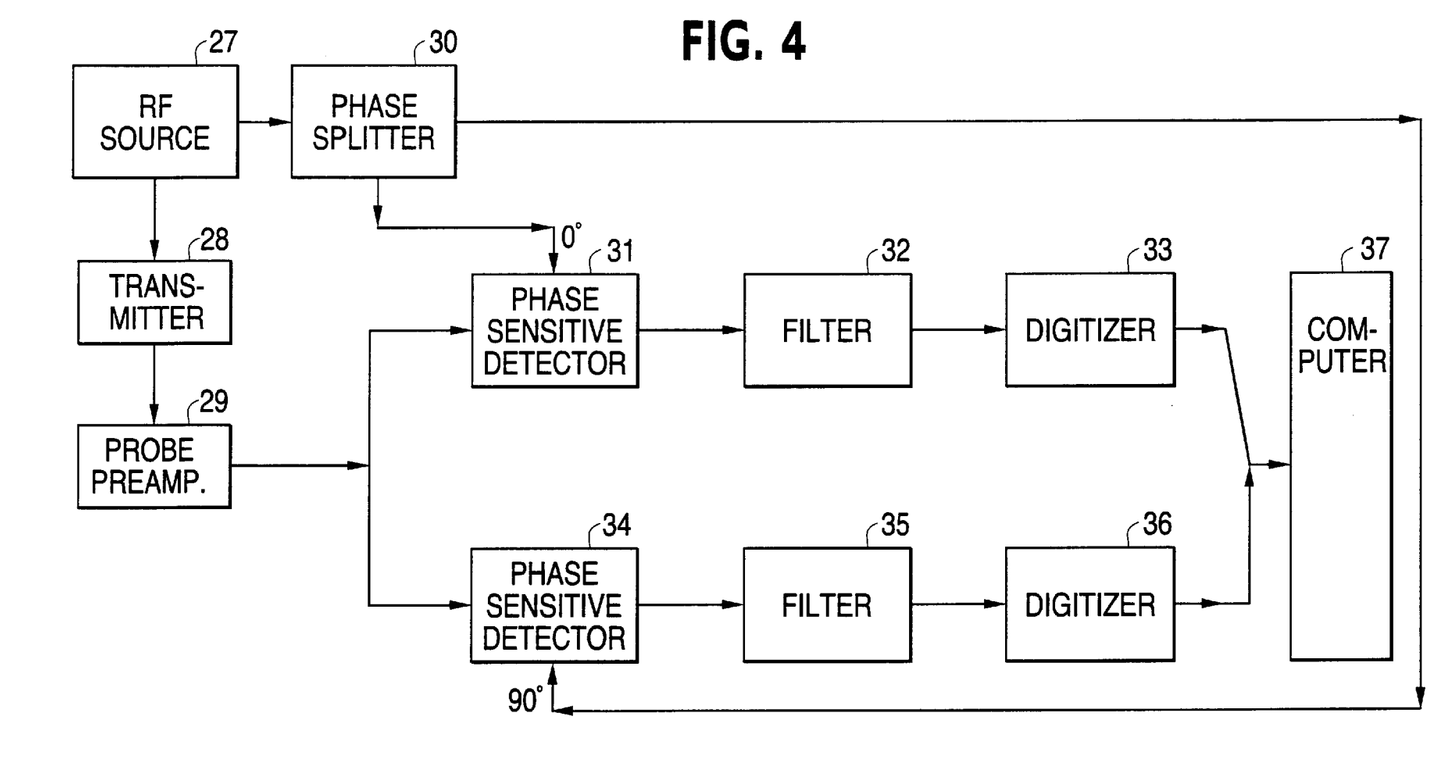
FIG. 4 is a block diagram of a two-quadrature phase receiver scheme.

Still another scheme uses two quadrature phase receivers, but generates a single real signal by routing alternate points of the signal respectively into the two receiver channels, accompanied by sign alternation in the computer after every two sampling points. This scheme, which is shown in FIG. 4 of the drawings accompanying this specification, also suffers from the mismatch of the two receiver channels noted above, resulting in image artifacts. Various components of the device, as shown in FIG. 4 with numerals, are described below:

27 refers to an RF source.
28 refers to the transmitter.
29 refers to the probe-preamplifier.
30 refers to the phase splitter.
31 and 34 refer to Phase Sensitive Detectors.
32 and 35 refer to Filters.
33 and 36 refer to Digitizers.
37 refers to the Computer.

Figure 5:
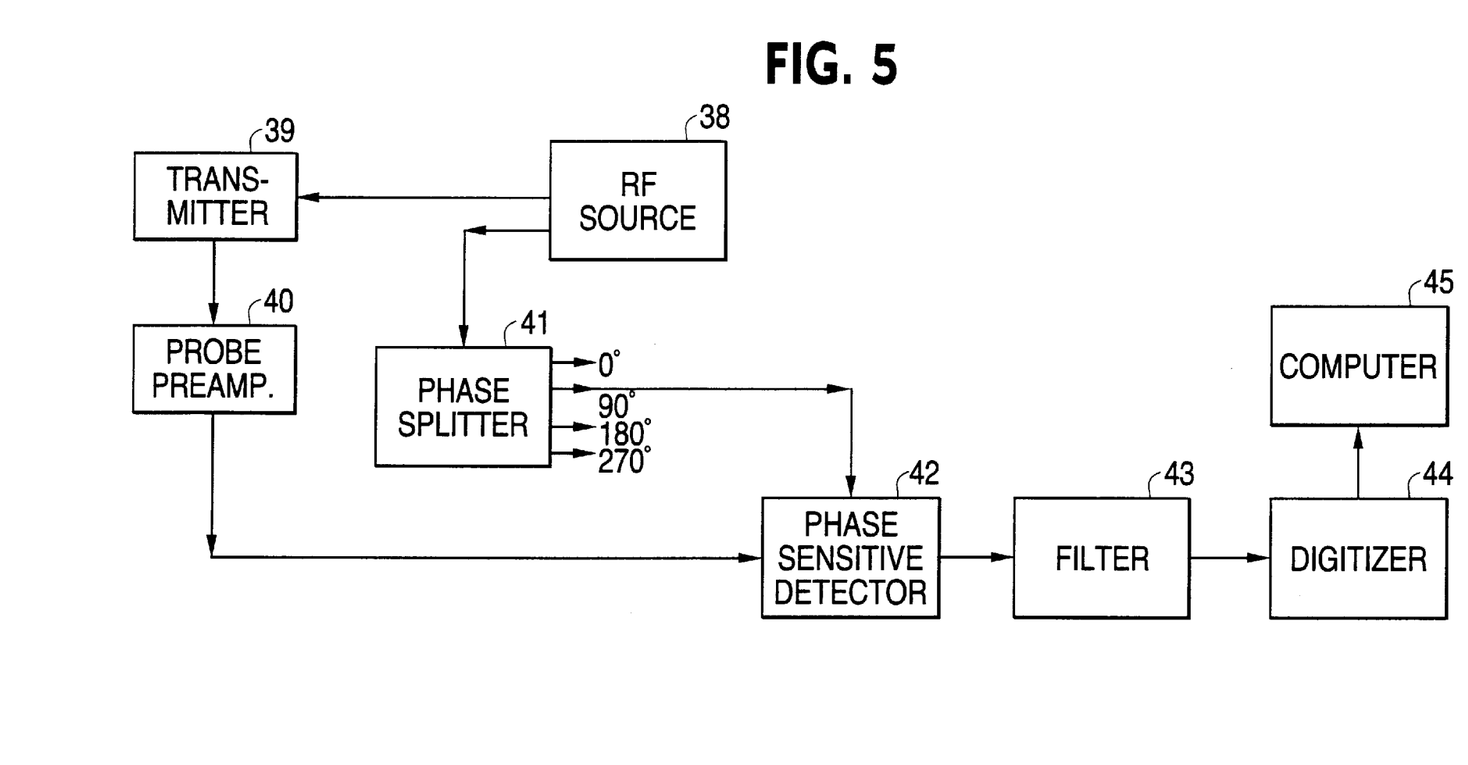
FIG. 5 is a block diagram of yet another single receiver scheme.

Yet another scheme uses a single receiver channel whose phase reference is incremented by 90° for every successive point of the signal that is acquired. This last scheme, shown in FIG. 5 of the drawings accompanying this specification, essentially comprises an RF source (38), transmitter (39), probe-preamplifier (40), a phase splitter (41) with four reference frequency outputs of phase 0°, 90°, 180°, and 270° respectively, a Phase sensitive Detector (42), Filter (43), Digitizer (44) and computer (45). This modus operandi also gives rise to artifact image peaks arising from the continual jump in receiver reference phase. Further, it suffers from a loss of signal detection sensitivity, owing to the periodic discrete phase jumps that result in sidebands.

Almost all practical quadrature detection systems that are currently in use employ one of the two two-channel receiver/digitizer implementations. Most recently, two-channel receiver/digitizer systems are employed with oversampling followed by signal decimation and digital filtering to produce quadrature detected spectra with improved dynamic range and baseline characteristics. The two-channel receiver systems require careful matching of the two receiver channels, as any mismatch results in artifacts. The single channel receiver systems is susceptible to either low sensitivity or low excitation efficiency or artifacts due to phase splitters.

SUMMARY OF THE INVENTION

The main objective of the present invention is to provide an improved device to detect magnetic resonance in the time domain with optimum sensitivity and freedom from artifacts.

Another objective of the present invention is to eliminate the artifacts due to the receiver system.

Yet another objective of the present invention is to ensure efficient use of available transmitter power.

Still another objective of the present invention is to reduce the cost of the detection system by retrieving the sensitivity advantage of quadrature detection with a single detection strategy, exhibiting none of the artifacts of quadrature detection or its hithertofore known alternatives.

DESCRIPTION OF THE DRAWINGS

In the drawings accompanying this specification block diagram of a two-receiver channel implementation.

DETAILED DESCRIPTION OF THE INVENTION

Figure 6:
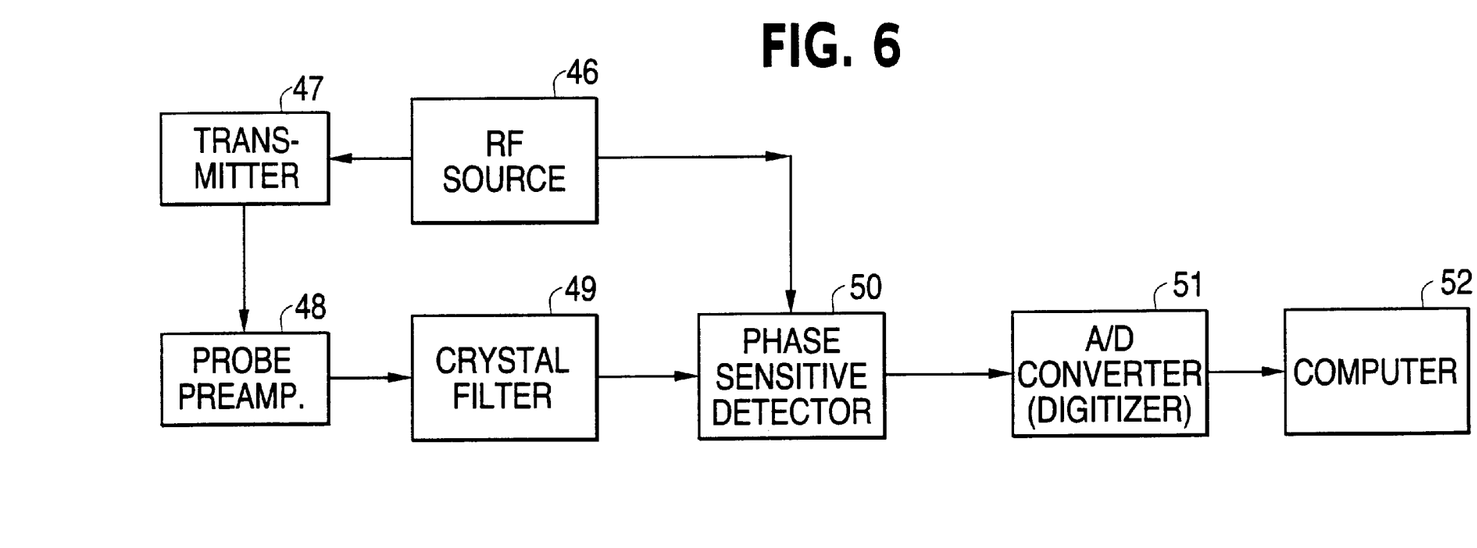
FIG. 6 depicts the block diagram of an embodiment of the device of the present invention and FIG. 7 is the block diagram of another embodiment of the device of the present invention.

Various components, as shown with numerals in FIG. 6 of the drawings accompanying this specification, are described below.

46 is an 4F source, which could be a variable frequency oscillator or synthesizer, giving contiuous wave (CW) rf output at the frequency of interest and which is capable of fast, phase coherent frequency switching;

47 is a transmitter that issues pulses for excitation of time domain magnetic resonance signals;

48 is a probe-preamplifier (the probe, also known as probehead, houses the sample for magnetic resonance investigation), which accepts pulse input from the transmitter 47 and delivers a signal from the sample, following excitation, to the input of a crystal filter 49;

49 is a crystal filter whose passband is positioned so as to extend from one end of the desired spectral window, corresponding to the position of the receiver reference frequency, to the other end of the spectral window;

50 is a standard phase sensitive detector which detects the signal from 49 with reference to a reference input from the RF source 46;

51 is a standard analog-to-digital converter (digitizer) which digitizes the low frequency output of 50;

52 is a standard compluter for storing the data digitized by 51

Figure 7:
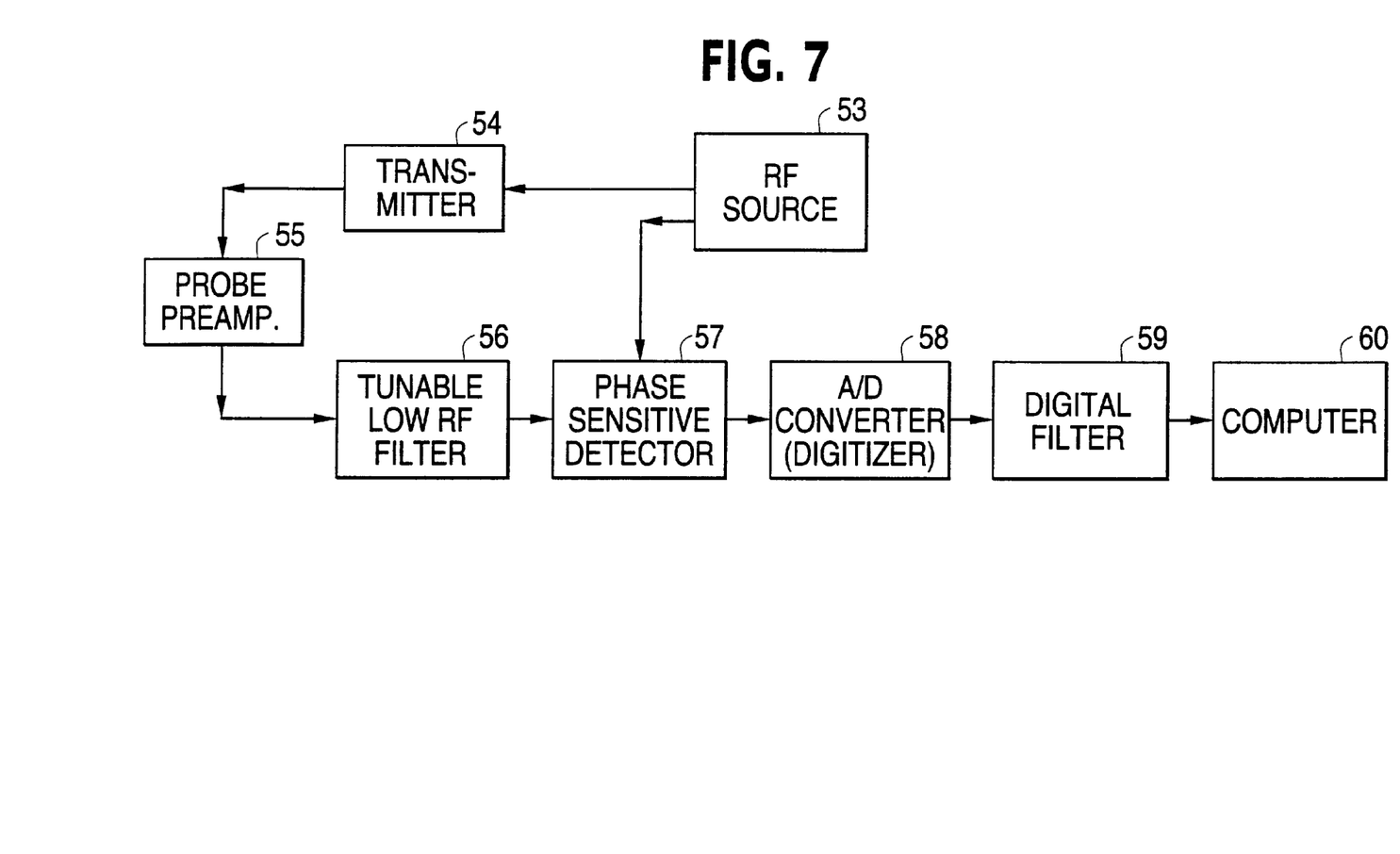

Similarly the various components, as shown with numerals in the FIG. 7 of the drawings accompanying this specification, are described below.

53 is an RF source, which could be a variable frequency oscillator or synthesizer, giving contiuous wave (CW) rf output at the frequency of interest and which is capable of fast, phase coherent frequency switching;

54 is a transmitter that issues pulses for excitation of time domain magnetic resonance signals;

55 is a probe-preamplifier (the probe, also known as probehead, houses the sample for magnetic resonance investigational) which accepts pulse input from the transmitter 54 and delivers a signal from the sample, following excitation, to a tunable low Q RF filter 56.

56 is a tunable low Q RF filter whose passband is positioned so as to extend from one end of the desired spectral window, corresponding to the position of the receiver reference frequency, to beyond its other end, and which serves to cut out noise from the side that is opposite to the spectral window with respect to the receiver reference frequency;

57 is a standard phase sensitive detector which detects the pre-filtered signal from 56, with reference to a reference input from the RF source 53;

58 is a standard analog-to-digital converter (digitizer) which digitizes the output of 57;

59 is a digital filter whose passband is centered at the center of the desired spectral window, whose bandwidth matches this window, and which serves to digitally filter the digitized output of the phase sensitive detector;

60 is a standard computer for storing the data digitized and digitally filtered by 58 and 59.

The present invention provides an improved device to detect magnetic resonance in the time domain, which consists of a) An RF source which is capable of fast, phase coherent frequency switching, b) A crystal filter which serves to cut out noise from outside the spectral window of interest.

or

Tunable low Q RF filter which serves to cut out noise from the side that is opposite to the spectral window with respect to the receiver reference frequency, and a digital filter which serves to digitally filter the phase detected, digitized signal.

Accordingly, the present invention provides an improved device to detect magnetic resonance in the time domain, which comprises an radiofrequency (RF) source (46), one of whose outputs is connected to a transmitter (47), the output of the transmitter (47) being fed to the probe-preamplifier (48), signal output of the probe-preamplifier (48) being connected to the input of a filter (49), the output of the filter (49) being connected to the input of a phase sensitive detector (50), another input of the phase sensitive detector (50) being connected to a second output of the RF source (46), the output of the phase sensitive detector (50) being connected to the input of a digitizer (51), the output of the digitizer (51) being connected to a computer (52) through a digital filter, if required.

The filter (49) used may be stitch as a crystal filter or a tunable low Q RF filter.

Another embodiment of the device of the present invention comprises an RF source (53), one of whose outputs is connected to a transmitter (54), the output of (54) being fed to the probe-preamplifier (55), the signal output of (55) being connected to the input of a tunable low Q RF filter (56), the output of (56) being connected to the input of a phase sensitive detector (57), another input of (57) being connected to a second output of the RF source (53), the output of (57) being connected to the input of a digitizer (58), the output of the digitizer (58) being connected to the input of a digital filter (59), the output of (59) being connected to a computer (60).

The phase sensitive detector and digitizer used may be single channel.

The device of the present invention works on the basis of phase coherent frequency switching, making use of the fact that signal excitation and detection occur in distinct time intervals in time domain magnetic resonance experiments. In operating the device of the present invention, the trasmitter is positioned at the center of the spectral window; after the pulse irradiation at this frequency excites any material exhibiting magnetic resonance, the receiver reference frequency is shifted phase coherently in a duration of 100 ns–4 $\mu$s, during the receiver dead-time, by one-half the desired spectral width, to coincide with one extreme of the spectral window. It achieves √2 sensitivity improvement over single detection as well. In an embodiment as shown in FIG. 6 of the drawings accompanying this specification, the sensitivity improvement is achieved by using a crystal filter interposed just before phase sensitive detection (psd), whose passband is positioned so as to extend from one end of the desired spectral window, corresponding to the position of the receiver reference frequency, to the other end of the spectral window. In an another embodiment, as shown in FIG. 7 of the drawings accompanying this specification, the sensitivity improvement is achieved by a two stage filtration: a tunable low Q RF filter interposed just before phase sensitive detection (psd), whose passband is positioned so as to extend from one end of the desired spectral window, corresponding to the position of the receiver reference frequency, to beyond the other end of the spectral window; followed by a post-psd digital filter whose passband is positioned at the center of the desired spectral window and whose bandwidth matches the spectral width. The signal is then acquired in single detection mode and subjected to a real Fourier transformation. Thus the device of the present invention detects magnetic resonance in the time domain in single detection mode, with √2 sensitivity improvement with respect to standard single detection and without sacrificing the efficient utilization of the transmitter power, and is free from artifacts of the dual channel receiver or the other disadvantages of the previously known detection schemes, as described earlier, by relying on the novel approach of phase coherent frequency switching of the receiver reference during the dead-time of the receiver, thereby completely avoiding the costs of a second receiver/digitizer channel.

The following examples are given by way of illustration of the present invention and should not be construed to limit the scope of the present invention.

EXAMPLE 1

Proton NMR signals at 7T were excited by a pulse issued from the broadband transmitter unit (solution state) of a Bruker MSL 300 P FT NMR spectrometer, with the transmitter positioned at the center of the spectral window; after the pulse irradiation at this frequency, the receiver reference frequency was shifted phase coherently by 1.5 kHz (one-half the desired spectral width) in a duration of 3.7 $\mu$s during the receiver dead-time, to coincide with one extreme of the spectral window. Following this, the signal was phase detected and digitized, after being prefiltered by a RF filter. Digital post filter was applied on the phase detected digital signal. Thus the signal was captured in single detection mode.

EXAMPLE 2

Deuterium NMR signal of $d_6$-dimethylsulfone at 7T was excited by a quad-echo pulse sequence issued from the high power transmitter of a Bruker MSL 300 P FT NMR spectrometer, with the transmitter positioned at the center of the spectral window; after the pulse sequence, the receiver reference frequency was shifted phase coherently in a duration of 3.7 $\mu$s by 62.5 kHz (one-half the desired spectral width) during the echo time, to coincide with one extreme of the spectral window. Signal acquisition was followed in single detection mode as in example 1.

EXAMPLE 3

Single crystals of fluoranthene hexafluorophosphate were mounted in a 300 MHz probe which was located in an electromagnet producing 107 G with 10 ppm homogeneity over 1 cm$^3$. The Electron Spin Resonance spectrum of this sample was investigated in pulsed mode. The reference frequency was shifted please coherently in 3.7 $\mu$s by 500 kHz from the center of the spectral window to one end after the excitation pulse which was issued from the decoupler channel of the Bruker MSL 300 P FT NMR spectrometer, and signal detection followed in single detection mode as in examples 1 and 2.

The main advantages of the Improved Device of the present invention are the following.

1. It permits the transmitter to be placed at the center of the spectral window, leading to optimal use of transmitter power.
2. It employs a single receiver and digitizer channel leading to an optimal detection system which is free from artifacts.
3. It does not involve continual reference phase jumps and thereby is completely free of the artifacts and loss of sensitivity associated with the phase jump method.
4. It does not involve any matching of receiver channels- there being but one-and is completely free of image peak artifacts.
5. It requires neither a second receiver channel, nor any phase cycling such as CYCLOPS.
6. It completely avoids the costs of a second receiver/digitizer channel.

We claim:

1. An improved device to detect magnetic resonance in the time domain, which comprises a radiofrequency (RF) source, wherein one of said RF source outputs is connected to a transmitter which has an output, the output of the transmitter being fed to a probe-preamplifier which has a signal output, said signal output of the probe-preamplifier being connected to one input of a phase sensitive detector, another input of the phase sensitive detector being connected to a second output of the RF source, wherein said phase sensitive detector has an output connected to an input of a digitizer, wherein an output of the digitizer is connected to a computer, and wherein said device uses phase coherent frequency switching to eliminate need for a second receiver channel.

2. An improved device, as claimed in claim 1 wherein the filter used is such as a crystal filter or a tunable low Q RF filter.

3. An improved device, as claimed in claims 1 or 2, where in a single channel phase sensitive detector and digitizer are used.

4. An improved device, as claimed in claim 1 wherein the output of the digitizer is connected through a digital filter to the computer.

5. An improved device as claimed in claim 4, wherein during operation of said device, said transmitter operates at a center frequency of a spectral window, and a receiver reference frequency is shifted in phase after pulse irradiation at said center frequency during dead-time of a receiver.

6. An improved device as claimed in claim 5, wherein said reference frequency is shifted coherently for a duration with a range of approximately 100 nanoseconds to 4 microseconds.

7. An improved device as claimed in claim 1, wherein said filter comprises a crystal filter that performs filtering before said phase sensitive detector operates.

8. An improved device as claimed in claim 7, wherein said phase sensitive detector utilizes a passband positioned so as to extend from an end of said spectral window corresponding to said receiver reference frequency to another end of said spectral window.

9. An improved device as claimed in claim 8, further comprising means for post-phase sensitive detection digital filtering positioned sequentially after said phase sensitive detector, and wherein said filter comprises a tunable low Q RF filter that performs filtering before said phase sensitive detector operates.

10. An improved device as claimed in claim 9, wherein said phase sensitive detector utilizes a passband positioned so as to extend from an end of said spectral window corresponding to said receiving reference frequency to beyond another end of said spectral window.

11. An improved device as claimed in claim 10, wherein said means for post-phase sensitive detection filtering utilizes a passband positioned at said center frequency and said passband has a bandwidth matching a spectral width of said spectral window.

12. An improved device to detect magnetic resonance in the time domain, which comprises a radiofrequency (RF) source having two outputs giving continuous wave RF output and capable of fast, phase coherent frequency switching, wherein one of said RF source outputs is connected to a transmitter which has an output, the output of the transmitter being fed to a probe-preamplifier which has a signal output, said signal output of the probe-preamplifier being connected to one input of a phase sensitive detector another input of the phase sensitive detector being connected to a second output of the RF source wherein said phase sensitive detector has an output connected to an input of a digitizer wherein an output of the digitizer is connected to a computer.

* * * * *